United States Patent
Platow et al.

(10) Patent No.: US 12,431,332 B2
(45) Date of Patent: Sep. 30, 2025

(54) HIGH ENERGY IMPLANTER WITH SMALL FOOTPRINT

(71) Applicant: Axcelis Technologies, Inc., Beverly, MA (US)

(72) Inventors: Wilhelm Platow, Newburyport, MA (US); Shu Satoh, Byfield, MA (US); Neil Bassom, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 181 days.

(21) Appl. No.: 18/474,402

(22) Filed: Sep. 26, 2023

(65) Prior Publication Data

US 2025/0104965 A1 Mar. 27, 2025

(51) Int. Cl.
  *H01J 37/147* (2006.01)
  *C23C 14/48* (2006.01)
  *H01J 37/317* (2006.01)

(52) U.S. Cl.
  CPC .......... *H01J 37/3171* (2013.01); *C23C 14/48* (2013.01); *H01J 37/147* (2013.01); *H01J 2237/0473* (2013.01); *H01J 2237/05* (2013.01); *H01J 2237/1508* (2013.01)

(58) Field of Classification Search
  CPC ................ H01J 37/3171; H01J 37/147; H01J 2237/0473; H01J 2237/05; H01J 2237/1508; H01J 37/05; C23C 14/48; H05H 2007/045; H05H 2277/12
  USPC ........................................... 250/492.1–492.3
  See application file for complete search history.

(56) References Cited

U.S. PATENT DOCUMENTS

| | | |
|---|---|---|
| 8,952,340 B2 | 2/2015 | Kabasawa et al. |
| 9,466,467 B2 | 10/2016 | Kabasawa et al. |
| 2015/0136996 A1 | 5/2015 | Inada et al. |
| 2020/0303163 A1 | 9/2020 | Matsushita et al. |
| 2021/0057182 A1 | 2/2021 | Satoh |
| 2023/0139138 A1* | 5/2023 | Platow ............ H05H 9/00 250/492.21 |

OTHER PUBLICATIONS

International Search Report and Written Opinion dated Dec. 17, 2024 in connection with Application Serial No. PCT/US2024/047048.

* cited by examiner

*Primary Examiner* — Michael Maskell
(74) *Attorney, Agent, or Firm* — Eschweiler & Potashnik, LLC

(57) ABSTRACT

A high-energy ion implantation system has an ion source and mass analyzer to form and analyze an ion beam along a beam path. A first RF LINAC accelerates the ion beam to a first accelerator exit, and a second RF LINAC accelerates the ion beam to a second accelerator exit along the beam path. A first magnet between the first and second RF LINACs alters the beam path along a first plane. A third RF LINAC accelerates the ion beam, and a second magnet between the second and third RF LINACs alters the beam path along a second plane. A beam shaping apparatus defines a shape of the ion beam, and a third magnet between the third RF LINAC beam shaping apparatus alters the beam path along a third plane, where the first, second, and third planes are not coplanar.

20 Claims, 4 Drawing Sheets

HIGH ENERGY IMPLANTER WITH SMALL FOOTPRINT

FIELD

The present disclosure relates generally to ion implantation systems, and more particularly to an ion implantation system having a small footprint for providing a desired ion beam current at a desired energy for a desired charge state.

BACKGROUND

In the manufacture of semiconductor devices, ion implantation is used to dope semiconductors with impurities. Ion implantation is a physical process, as opposed to diffusion, which is a chemical process that is employed in semiconductor apparatus fabrication to selectively implant dopant into a semiconductor workpiece and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a workpiece or wafer. The dopant ions physically bombard the workpiece, enter the surface and typically come to rest below the workpiece surface in the crystalline lattice structure thereof.

Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. When implanting ions into silicon wafers, ions generated from source materials such as antimony, arsenic, or phosphorus, for example, results in an "n-type" extrinsic material wafer, whereas a "p-type" extrinsic material wafer often results from ions generated with source materials such as boron, gallium, or indium. When implanting ions into silicon carbide (SiC) wafers, for example, nitrogen (n-dopant) and aluminum (p-dopant) are conventionally used as ion species.

High-energy ion implantation systems (e.g., systems configured to implant ions at energies greater than 1 MeV) generally comprise a plurality of beamline components, such as an ion source, a linear accelerator, an energy filter magnet, a beam-shaping apparatus, and a process chamber, whereby the conventional beamline components are arranged in a horizontal plane, often forming a polygonal chain. As such, a footprint of conventional high-energy ion implantation system is substantially large. High-energy ion implantation systems typically require a clean environment, also called a clean room environment, whereby the clean room environments are generally costly to build and maintain. As such, a large footprint utilized by a conventional high-energy ion implantation system can lead to substantial costs to semiconductor chip manufacturers in designing and maintaining a chip fabrication facility.

SUMMARY

The present disclosure appreciates that significant demands for an ion implantation recipe (e.g., ion beam energy, mass, charge value, beam purity, beam current and/or total dose level of the implantation) at a high energy level call for providing a higher beam current and a sufficient beam purity that does not compromise the ion source. As such, various systems or methods for providing a high beam current along with a high beam purity are provided herewith.

Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Aspects of the disclosure facilitate high energy ion implantation processes for implanting ions into a workpiece. According to one exemplary aspect, an ion implantation system is provided having an ion source configured to form an ion beam, a beamline assembly configured to selectively transport the ion beam, and an end station is configured to accept the ion beam for implantation of ions into a workpiece.

In accordance with one example aspect of the present disclosure, the ion source is configured to form an ion beam along a beam path, and a mass analyzing magnet is configured to mass analyze the ion beam along the beam path. A first RF linear accelerator (e.g., a first acceleration stage), for example, is configured to receive the ion beam at a first accelerator entrance thereof from the mass analyzer, and to accelerate the ion beam to a first accelerator exit along the beam path. A second RF linear accelerator (e.g., a second acceleration stage), for example, is configured receive the ion beam at a second accelerator entrance thereof and to accelerate the ion beam to a second accelerator exit along the beam path. A first magnet, for example, is disposed between the first accelerator exit and the second accelerator entrance along the beam path, wherein the first magnet is configured to alter a trajectory of the beam path by greater than 90° along a first plane.

In accordance with one example, the high-energy ion implantation system further comprises a beam shaping apparatus having a beam shaping entrance and a beam shaping exit along the beam path. The beam shaping apparatus, for example, is configured to define a shape of the ion beam along the beam path. The beam shaping apparatus, for example, can define an S-shaped bend in the beam path of the ion beam. Further, in the present example, a second magnet is disposed between the second accelerator exit and the beam shaping entrance along the beam path, wherein the second magnet is configured to alter the trajectory of the beam path by greater than 90° along a second plane, and wherein the first plane and the second plane are not coplanar.

In accordance with another example aspect of the disclosure, the high-energy ion implantation system further comprises a third RF linear accelerator (e.g., a third acceleration stage) configured receive the ion beam at a third accelerator entrance thereof from the second magnet and to accelerate the ion beam to a third accelerator exit along the beam path. A third magnet, for example, is further provided and disposed between the third accelerator exit and the beam shaping entrance along the beam path. The third magnet, for example, is further configured to alter the trajectory of the beam path by greater than 90° along a third plane, wherein the third plane and the second plane are not co-planar. For example, the first plane and the third plane can be approximately parallel to one another.

In one example, the first magnet is configured to maximize a first energy spectrum of the ion beam passing between the first accelerator exit and the second accelerator entrance. The second magnet, for example, can be configured to maximize a second energy spectrum of the ion beam passing between the second accelerator exit and the third accelerator entrance. Further, the third magnet can be configured to maximize a third energy spectrum of the ion beam passing between the second accelerator exit and the beam shaping entrance. In another example, one or more of the first magnet, the second magnet, and the third magnet are configured to minimize an energy dispersion of the ion beam.

According to another example, the first linear accelerator, the first magnet, and the second linear accelerator generally define a first U-shape of the beam path. The second linear accelerator, the second magnet, and the third linear accelerator, for example, can generally define a second U-shape of the beam path, and the third linear accelerator, the third magnet, and the beam shaping apparatus generally define a third U-shape of the beam path.

The first linear accelerator, the second linear accelerator, and the third linear accelerator, for example, comprise respective first, second, and third RF acceleration stages of an RF linear accelerator comprising a plurality of RF resonators configured to generate an accelerating RF field. In one alternative, the second linear accelerator and the third linear accelerator comprise a combination of RF linear accelerators and DC acceleration columns. In another example, the beam shaping apparatus comprises a scanner apparatus configured to scan the ion beam in a first direction to define a scanned ion beam. An angle corrector lens, for example, is further provided and configured to parallelize and shift the scanned ion beam prior to the ion beam impacting a workpiece positioned in a process chamber along the beam path. A final energy magnet can be further provided (e.g., a magnet after the last linear accelerator), wherein the final energy magnet comprises an energy defining aperture. The final energy magnet, for example, is configured to bend the ion beam at a predetermined angle, wherein the energy defining aperture is configured to pass only desired ions at a desired energy range or spread therethrough.

According to another example aspect of the disclosure, the first plane is offset from the second plane by greater than approximately 45°. For example, the first plane is offset from the second plane by approximately 90°. For example, one or more of the first magnet, second magnet, and third magnet are configured to alter the trajectory of the beam path by approximately 180° along the respective first plane, second plane, and third plane. One or more of the first magnet, the second magnet, and the third magnet comprise a plurality of pole faces configured to minimize an energy dispersion of the ion beam. For example, one or more of the first magnet, the second magnet, and the third magnet comprise one of a magnetic quadrupole or an electrostatic quadrupole.

In accordance with another example of the present disclosure, a high-energy ion implantation system is provided comprising an ion source configured to form an ion beam along a beam path. A mass analyzer is provided downstream of the ion source and configured to mass analyze the ion beam along the beam path. A first RF linear accelerator, for example, is configured to receive the ion beam at a first accelerator entrance thereof from the mass analyzer and to accelerate the ion beam to a first accelerator exit along the beam path. A second RF linear accelerator, for example, is configured receive the ion beam at a second accelerator entrance thereof and to accelerate the ion beam to a second accelerator exit along the beam path.

A first magnet, for example, is disposed between the first accelerator exit and the second accelerator entrance along the beam path, wherein the first magnet is configured to alter a trajectory of the beam path by approximately 180° along a first plane. A third RF linear accelerator, for example, is configured to receive the ion beam at a third accelerator entrance thereof and to accelerate the ion beam to a third accelerator exit along the beam path. A second magnet, for example, is disposed between the second accelerator exit and the third accelerator entrance along the beam path, wherein the second magnet is configured to alter the trajectory of the beam path by approximately 180° along a second plane.

A beam shaping apparatus, for example, has a beam shaping entrance and a beam shaping exit along the beam path, wherein the beam shaping apparatus is configured to define a shape of the ion beam along the beam path. Further, a third magnet is disposed between the third accelerator exit and the beam shaping entrance along the beam path, wherein the third magnet is configured to alter the trajectory of the beam path by approximately 180° along a third plane, and wherein the first plane, the second plane, and the third plane are not coplanar.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
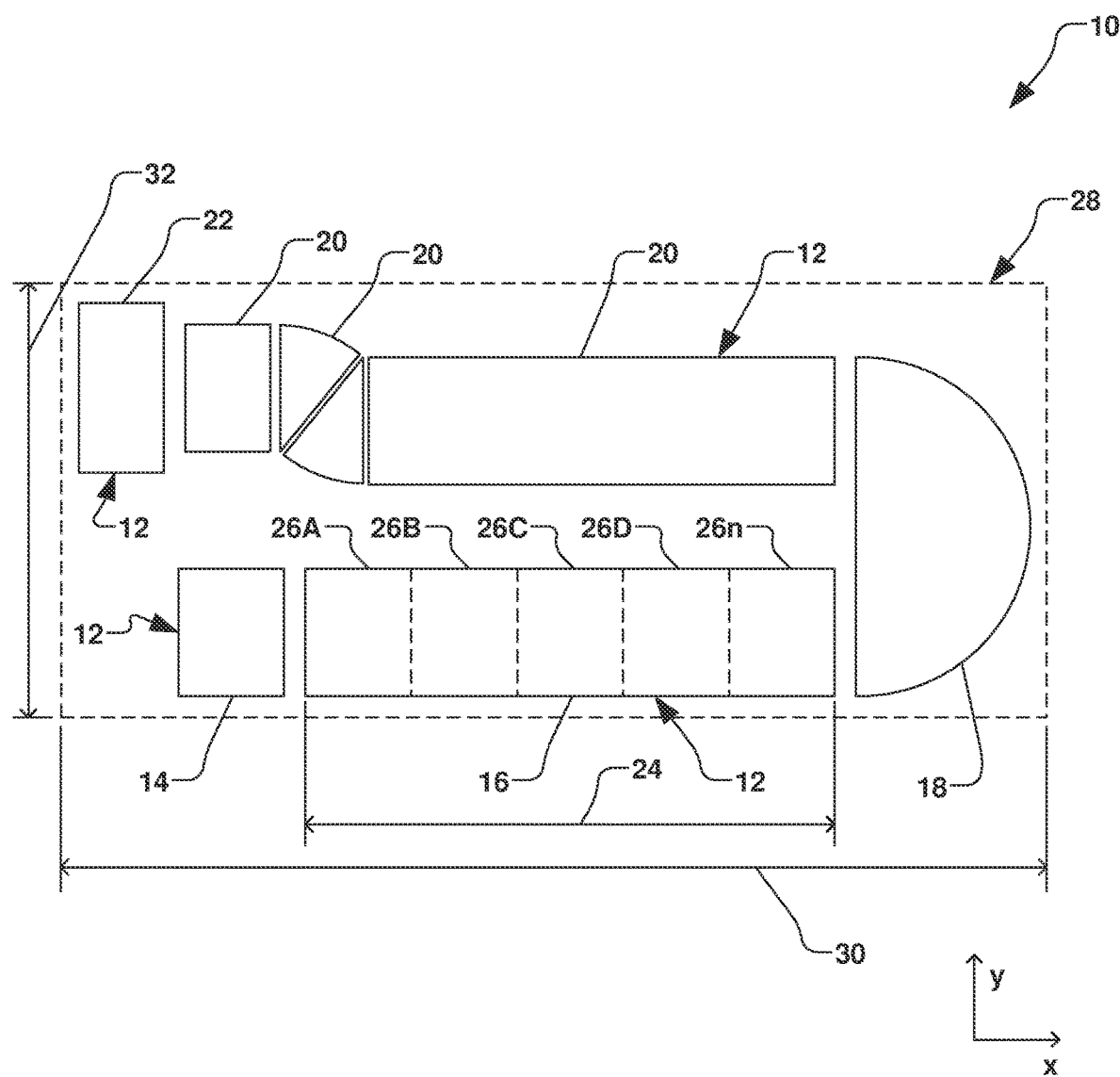
FIG. 1 is a schematic illustrating a conventional ion implantation system having a substantially planar ion beam path.

The present disclosure is directed generally toward various apparatuses, systems, and methods associated with implantation of ions into a workpiece. More specifically, the present disclosure is directed to an ion implantation system having a small footprint and increased ion beam current at a high energy for a desired charge state.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, or other physical or functional units shown in the drawings or described herein could also be implemented by an indirect connection or coupling. Furthermore, it is to be appreciated that functional blocks or units shown in the drawings may be implemented as separate features or components in one embodiment, and may also or alternatively be fully or partially implemented in a common feature or component in another embodiment.

High-energy ion implantation systems (e.g., systems configured to implant ions at energies greater than 1 MeV, such as those implemented in the formation of image sensors) are notoriously long in size. In order to minimize a footprint and save cleanroom space, RF linear accelerators (LINACs) or DC accelerator columns can be broken into sections and separated by bending magnets. The bending magnets, for example, allow the beamline to be more compact by bending the ion beam to various desired angles. For example, the beamline can be V-shaped or a generally polygonal chain.

A simple system, for example, can comprise first and second accelerator stages or LINACs separated by one bending magnet. For such an arrangement, the present disclosure appreciates that it can be advantageous to add a so-called stripper after the first acceleration stage, wherein the stripper is configured to strip electrons from ions of the ion beam, thus increasing a charge state of the ions. As such, the second acceleration stage can increase the energy by a factor equal to the charge state. Such an arrangement allows the footprint of the system to be substantially reduced, as compared to a system without a bending magnet.

The ion beam exiting the stripper, for example, contains ions of many various charge states, wherein some undesirable charge states are included in the ion beam. With the aforementioned bending magnet, such unwanted charge states can be separated from the beam path, thus preventing contamination of the ion beam. However, when separating two or more LINACs with a bending magnet, the present disclosure appreciates that the ion beam will also contain a degree of energy spread that also should be transported through the bending magnet to maintain beam current, otherwise beam currents will be substantially lower.

Such a bending magnet can be considered an achromatic system, as it is, to some degree, independent of the energy. The present disclosure appreciates that one issue associated with separating first and second LINACs while having a stripper disposed therebetween, is that on one hand, the bending magnet should filter out unwanted charge states, while on the other hand, the bending magnet should be substantially achromatic (e.g., having a low dispersion) in order to accept and pass an ion beam therethrough with an energy spread of typically 1-2%.

The present disclosure contemplates a high energy ion implantation system having a small footprint, whereby a plurality of beamline components comprise a linear accelerator component comprised of a plurality of acceleration sections, and whereby the plurality of acceleration sections are operably joined or coupled along the beamline via a plurality of achromatic bending magnets. This present disclosure, for example, further provides an arrangement of the plurality of beamline components in two or more planes. For example, the two or more planes can be orthogonal to one another, such as a horizontal plane and a vertical plane. Accordingly, at least a portion of the plurality of beamline components, such as one or more of the linear accelerator components and one or more beam-shaping components, can be effectively stacked atop one another, thereby minimizing the footprint of the high energy ion implantation system.

By way of example, a schematic of a conventional single-bend high-energy implanter 10 is shown in FIG. 1, wherein the single-bend high-energy implanter comprises a plurality of components 12. For simplification, some of the plurality of components 12 are illustrated as comprising an ion source combined with an analyzing magnet 14 (also called an injector), a linear accelerator 16, an energy filter magnet 18, a beam-shaping section 20, and a process chamber 22. When designed for implanting high energy ions, a length 24 of the linear accelerator 16 of the single-bend high-energy implanter 10 is typically increased due to a number n of acceleration stages 26A . . . 26n provided within the linear accelerator.

In one example, a footprint 28 of the single-bend high-energy implanter 10 can be decreased by splitting the linear accelerator 16 into a plurality of shorter linear accelerators (e.g., a first section comprising acceleration stages 26A-26C and a second section comprising acceleration stages 26D-26n), whereby the plurality of shorter linear accelerators are separated from one another by a bending magnet, while maintaining the linear accelerator in substantially the same plane (e.g., along the x-y axis) as the remainder of the plurality of components 12. Conventionally, such a splitting of the linear accelerator 16 has been shown to decrease a length 30 of the footprint 28 of the single-bend high-energy implanter 10, but a commensurate increase in a width 32 of the footprint also follows. As such, the conventional modifications to the single-bend high-energy implanter 10, including splitting of the linear accelerator 16, have provided only modest decreases in the footprint 28 in production facilities.

As opposed to the conventional arrangements of the plurality of components generally along a single plane, the present disclosure contemplates an architecture whereby multiple linear accelerators are coupled to one another such that one or more bending magnets alter the arrangement to one or more additional planes, thus providing a substantial advantage in decreasing the footprint of the resultant implanter. Thus, in accordance with the present disclosure, a multiple-bend high-energy implanter 100 is illustrated in the example shown in FIG. 2. The multiple-bend high-energy implanter 100, for example, comprises a plurality of beamline components 102, such as an ion source 104, a linear accelerator apparatus 106, an energy filter apparatus 108, a beam shaping apparatus 110, and a process chamber 112. The plurality of beamline components 102 generally define a beamline 114 whereby an ion beam 116 is formed, accelerated, shaped, and directed toward the process chamber 112 along a beam path 118 (illustrated by dotted line) by the plurality of beamline components.

In accordance with one example, the linear accelerator apparatus 106 of the multiple-bend high-energy implanter 100 comprises an offset linear accelerator apparatus 120, wherein the offset linear accelerator apparatus alters the beam path 118 from a first plane 122 (e.g., the x-y plane) to a second plane 124 (e.g., the x-z plane). In the present example, the first plane 122 and the second plane 124 are offset from one another by approximately 90 degrees. However, the present disclosure contemplates the first plane 122 and the second plane 124 being offset by any angle, such as an angle greater than approximately 45 degrees, whereby a size of the ion implantation system 100 can be advantageously minimized and/or controlled.

Figure 2:
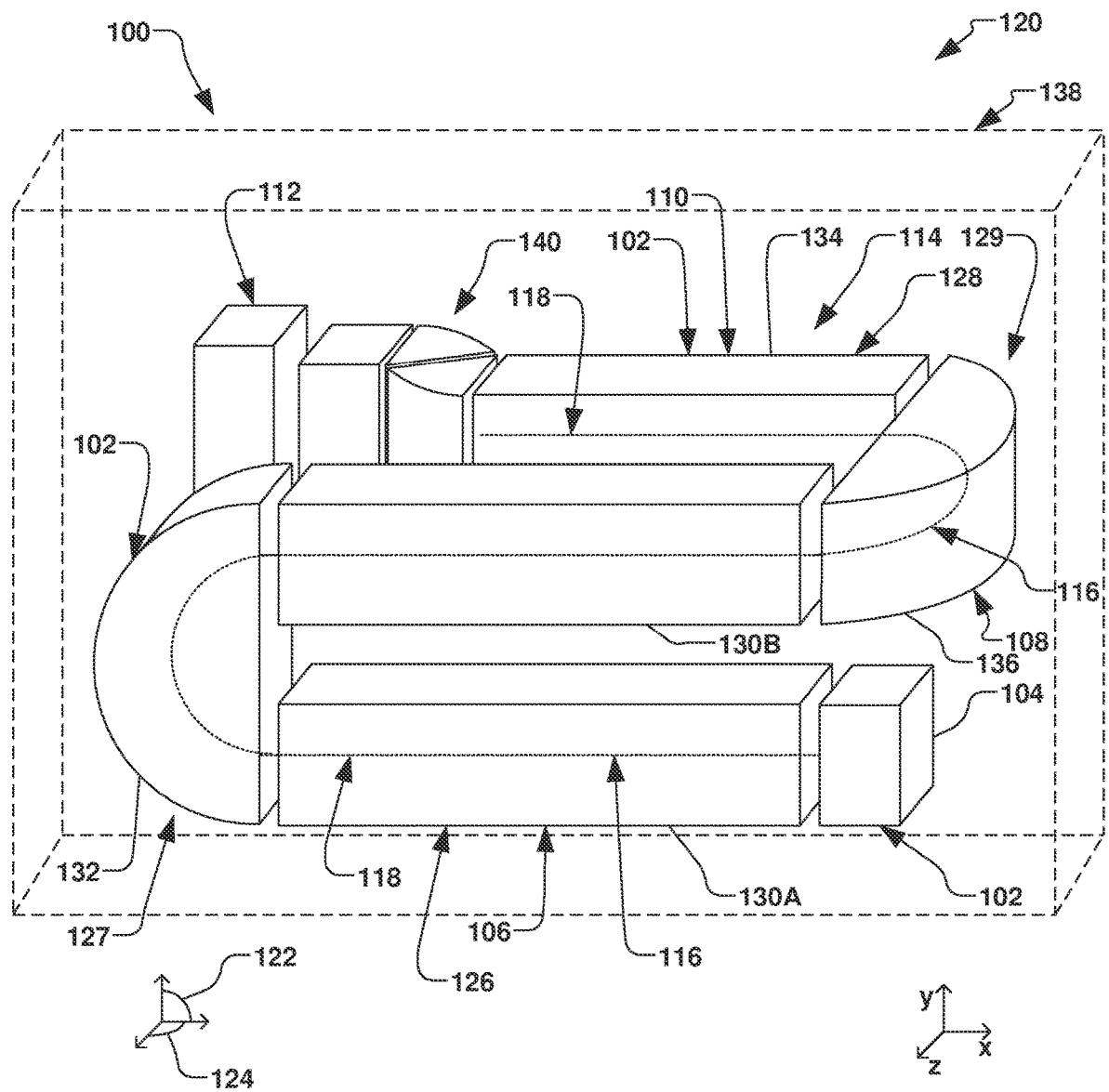
FIG. 2 is a simplified perspective view of a multiple-bend high-energy ion implantation system having a multi-planar beam path according to various example aspects of the present disclosure.

In the present example, a first component group 126 of the plurality of beamline components 102 are generally aligned along the first plane 122, wherein the first component group of the plurality of beamline components generally defines a first U-shape 127 of the beam path 118. A second component group 128 of the plurality of beamline components 102, for example, are generally aligned along the second plane 124, wherein the second component group of the plurality of beamline components generally defines a second U-shape 129 of the beam path 118. It is noted that while the first U-shape 127 and second U-shape 129 illustrated in FIG. 2 provide respective 180° bends in the beam path 118, the present disclosure contemplate any U-shape angle ranging between 90° and 270°.

The offset linear accelerator apparatus 120, for example, comprises a first accelerator section 130A, a second accelerator section 130B, a first bending magnet 132, at least a first portion 134 of the beam shaping apparatus 110, and a second bending magnet 136 (e.g., the energy filter apparatus 108). The first and second accelerator sections 130A, 130B, for example, are separated by the first bending magnet 132, and are generally arranged along the first plane 122, generally forming the first U-shape 127. The second accelerator section 130B and at least the first portion 134 of the beam shaping apparatus 110, for example, are separated by the second bending magnet 136, and are generally arranged along the second plane 124 to generally form the second U-shape 129. In the present example, the second accelerator section 130B is generally coplanar with both the first plane 122 and the second plane.

In one example, the first accelerator section 130A and the second accelerator section 130B are stacked or extend vertically, and the second accelerator section 130B and at least the first portion 134 of the beam shaping apparatus 110 extend horizontally, whereby the first bending magnet 132 and the second bending magnet 136 each have a bending angle of approximately 180°. In the example illustrated in FIG. 2, the ion source 104 is generally positioned lower than the beam shaping apparatus 110 and process chamber 112.

Figure 3:
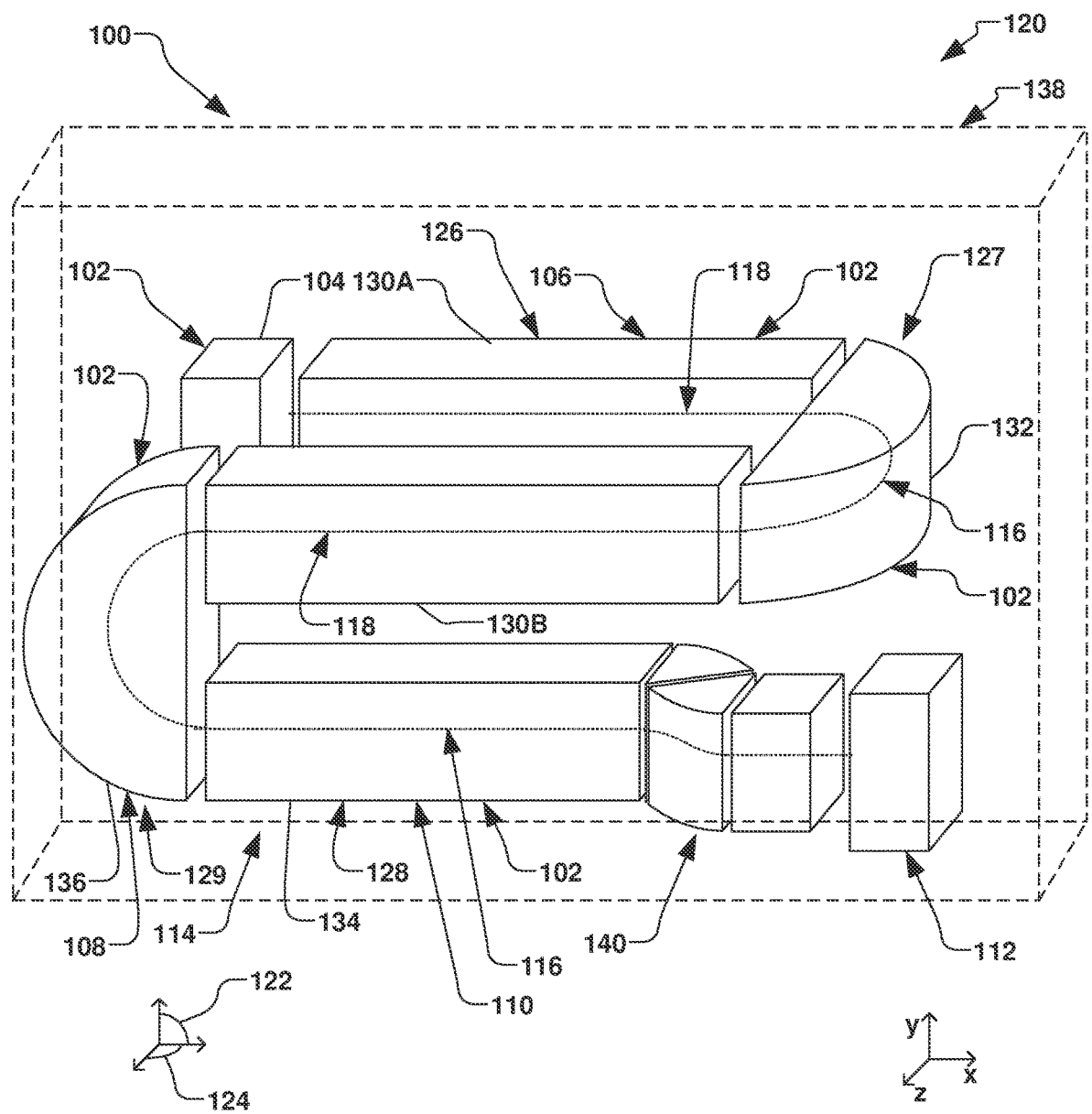
FIG. 3 is a simplified perspective view of another multiple-bend high-energy ion implantation system having another multi-planar beam path according to various example aspects of the present disclosure.

In another example, as illustrated in FIG. 3, the first accelerator section 130A and the second accelerator section 130B are horizontally oriented, whereby at least the first portion 134 of the beam shaping apparatus 110 is stacked vertically with respect to the second accelerator section. As such, the ion source 104 is generally positioned above the beam shaping apparatus 110 and process chamber 112. In either of the examples shown in FIGS. 2 and 3, a footprint 138 of the respective multiple-bend high-energy ion implantation system 100 can be made significantly smaller than conventional systems, as the first and second bending magnets 132, 136 are positioned so as to provide acceleration of the ion beam 116 along the beam path 118 in two different planes (e.g., bent at an angle of greater than 45°).

Referring again to FIG. 2, the first and second accelerator sections 130A, 130B and at least the first portion 134 of the beam shaping apparatus 110 for example, can be horizontally and vertically shifted at various angles relative to the beam path 118 in order to provide or customize the footprint 138 based on various considerations, such as horizontal and vertical space limitations associated with a clean room. The present disclosure further contemplates a final beam corrector 140, such as an S-bend magnet, a corrector magnet, or a P-lens, that can be incorporated in the plurality of beamline components 102 in order to collimate a divergent scanned ion beam along the beam path 118. The final beam corrector 140, for example, can further alter the beam path 118 in one or more of the first plane 122 and the second plane 124, thereby further decreasing the footprint 138.

Figure 4:
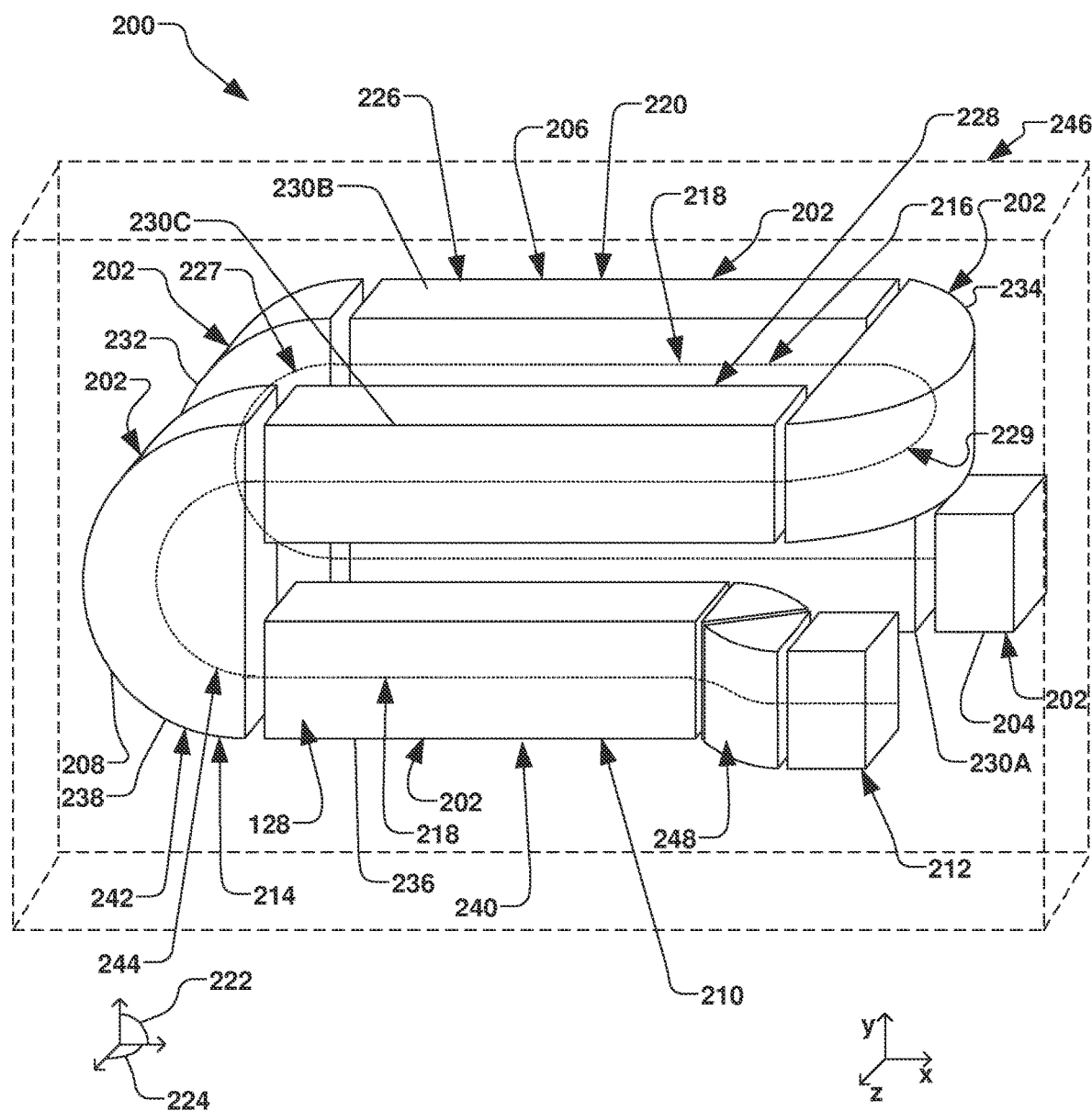
FIG. 4 is a simplified perspective view of yet another multiple-bend high-energy ion implantation system having yet another multi-planar beam path according to various example aspects of the present disclosure.

In accordance with another example, a multiple-bend high-energy implanter 200 is illustrated in the example shown in FIG. 4. In a similar manner as discussed above, the multiple-bend high-energy implanter 200, for example, comprises a plurality of beamline components 202, such as an ion source 204, a linear accelerator apparatus 206, an energy filter apparatus 208, a beam shaping apparatus 210, and a process chamber 212. The plurality of beamline components 202 generally define a beamline 214 whereby an ion beam 216 is formed, accelerated, shaped, and directed toward the process chamber 212 along a beam path 218 (illustrated by dotted line) by the plurality of beamline components.

The linear accelerator apparatus 206 of the multiple-bend high-energy implanter 200 comprises an offset linear accelerator apparatus 220, wherein the offset linear accelerator apparatus alters the beam path 218 between a first plane 222 (e.g., the x-y plane) and a second plane 224 (e.g., the x-z plane). In the present example, the first plane 222 and the second plane 224 are offset from one another by approximately 90°. The present disclosure again contemplates the first plane 222 and the second plane 224 being offset by any angle greater than approximately 45°, whereby a size of the multiple-bend high-energy implanter 200 can be advantageously controlled.

In this example, a first component group 226 of the plurality of beamline components 202 are generally aligned along the first plane 222, wherein the first component group of the plurality of beamline components generally defines a first U-shape 227 of the beam path 218. A second component group 228 of the plurality of beamline components 202 are generally aligned along the second plane 224, wherein the second component group of the plurality of beamline components generally defines a second U-shape 229 of the beam path 218. The offset linear accelerator apparatus 220 of the present example, comprises a first accelerator section 230A, a second accelerator section 230B, and a third accelerator section 230C, whereby the first and second accelerator sections are separated by a first bending magnet 232, and the second and third accelerator sections are separated by a second bending magnet 234. In the present example, the first component group 226 comprises the ion source 204, first accelerator section 230A, first bending magnet 232, and second accelerator section 230B, and the second component group 228 comprises the second accelerator section 230B, the second bending magnet 234, and the third accelerator section 230C. As such, the second accelerator section 230B is generally coplanar with the first plane 222 and the second plane 224.

The third accelerator section 230C and a first portion 236 of the beam shaping apparatus 210, for example, are further separated by a third bending magnet 238 (e.g., a final energy magnet). As such, a third component group 240 of the plurality of beamline components 202 are generally aligned along a third plane 242, wherein the third component group of the plurality of beamline components generally defines a third U-shape 244 of the beam path 218.

As illustrated in the present example, the first and second accelerator sections 230A, 230B are separated by the first bending magnet 232, and are generally arranged along the first plane 222, and the second and third accelerator sections 230B, 230C are separated by the second bending magnet 234, and are generally arranged along the second plane 224. The first and second planes 222, 224, for example, are offset from one another by approximately 90°, however, other angular offsets are contemplated. The third accelerator section 230C and the first portion 236 of the beam shaping apparatus 210, for example, are separated by the third bending magnet 238, and are generally arranged along the third plane 242, wherein the third plane is offset from the second plane 224 by approximately 90°, whereby the third plane is approximately parallel to the first plane 222. It should be noted, however, that the first, second, and third planes 222, 224, 242 can all intersect one another at various angles, and all such angles are contemplated as falling within the scope of the present disclosure.

The present disclosure thus provides the multiple-bend high-energy implanter 200 to accommodate various sizes or shapes of a clean room in which the multiple-bend high-energy implanter is to be located, whereby any of the first, second, and third U-shapes 227, 229, 244 advantageously provide a smaller footprint than conventionally seen. It is also noted that the first, second, and third U-shapes 227, 229, 244 can provide for various advantages, such as a positioning of the ion source 204 and process chamber 212 on similar or differing vertical positions for ease of access or other considerations.

For example, the first accelerator section 230A and the second accelerator section 230B are stacked vertically, and the second accelerator section 230B and the third accelerator section 230C extend horizontally, whereby the first bending magnet 232 and the second bending magnet 234 each have a bending angle of approximately 180°. Further, the third accelerator section 230C and the first portion 236 of the beam shaping apparatus 210 are stacked vertically, whereby the third magnet 238 has a bending angle of approximately 180°.

In the example illustrated in FIG. 4, the ion source 204 is generally positioned proximate to, but offset from, the process chamber 212. As such, a footprint 246 of the multiple-bend high-energy implanter 200 can be made significantly smaller than conventional systems. Again, a final beam corrector 248, such as an S-bend magnet, a corrector magnet, or a P-lens, that can be provided for collimation of a divergent scanned ion beam along the beam path 218. The final beam corrector 248, for example, can further alter the beam path 218 in one or more of the first plane 222 and the second plane 224, thereby further decreasing the footprint 246.

Accordingly, the present disclosure provides the capacity for longer and/or a greater number of acceleration stages, thereby having the capability of providing higher energy implants, while maintaining a relatively small footprint. As such, a significant savings can be achieved by reducing costly clean room space when compared to conventional systems. The present disclosure contemplates any of the first, second, or third bending magnets 232, 234, 238 as having a bending angle of greater than 90°. As such, the first, second, and third linear accelerator sections 230A-230C and the first portion 236 of the beam shaping apparatus 210 can be non-parallel to one another, thus leading to the footprint 246 being smaller than a conventional footprint along a generally singular plane.

It should be noted that for clarity, the present examples are illustrated omitting various features of the ion implantation systems such as resonators, a stripper and a corrector magnet. However, although not illustrated, such various features are contemplated by the present examples, whereby the present disclosure not only provides footprint advantages over conventional systems, but can also advantageously overcome various other shortcomings of conventional systems by achieving compliance with high voltage stand-off requirements and providing easier access for maintenance, etc.

The present disclosure further contemplates the various bending magnets (e.g., the first, second, and third bending magnets 232, 234, 238 as comprising fixed magnets in some examples, while in other example, other bending apparatuses and methods are contemplated for redirecting the ion beam 116, such as a provision of electrostatic sector fields (also called cylindrical or spherical condensers). The present disclosure also contemplates the implementation of achromatic bending systems having minimal dispersion. Alternatively, quadrupole magnets and beam steering apparatuses can be implemented to re-focus various beam components in order to guide the ion beam into the desired direction or position. Thus, a combination of achromatic bends, quadrupoles and beam-steering devices can be advantageous. Further, the disclosure contemplates various diagnostic devices, such as movable Faraday cups, selectively positioned after each bending magnet, such that tuning of the ion beam 116 can be performed to verify beam location and angles.

The present disclosure thus advantageously stacks linear accelerators along the beamline in two or more dimensions (e.g., in one or more vertical and horizontal directions, and/or any direction therebetween) in order to minimize the footprint of the ion implantation system. The present disclosure appreciates numerous advantages in minimizing the footprint of the ion implantation system, as the ion implantation system is operated in clean room environment. As the energies of ion implantation systems increases, the size of the clean rooms has conventionally expanded, whereby increased costs associated with the larger clear rooms have been conventionally seen. The present disclosure advantageously minimizes the size of higher energy ion implantation systems, whereby a smaller clean room can be used to accommodate systems that previously required much larger and expensive clean rooms.

The bending magnets 232, 234, 238 of the present disclosure are configured to bend the ion beam approximately 180°, whereby the bending magnets have a low dispersion. The present disclosure appreciates that the bending magnets 232, 234, 238 associated with the linear accelerator apparatus 206 having a respective bending angle of approximately 180° generally permits all of the energy spread. Additional magnets, such as a final energy magnet associated with the beam shaping apparatus comprise an aperture or energy resolving slit before the beam shaping and scanning.

Although the disclosure has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the disclosure.

In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A high-energy ion implantation system comprising:
   an ion source configured to form an ion beam along a beam path;
   a mass analyzer configured to mass analyze the ion beam along the beam path;
   a first linear accelerator configured to receive the ion beam at a first accelerator entrance thereof from the mass analyzer and to accelerate the ion beam to a first accelerator exit along the beam path;
   a second linear accelerator configured to receive the ion beam at a second accelerator entrance thereof and to accelerate the ion beam to a second accelerator exit along the beam path;
   a first magnet disposed between the first accelerator exit and the second accelerator entrance along the beam path, wherein the first magnet is configured to alter a trajectory of the beam path by greater than 90° along a first plane;
   a beam shaping apparatus having a beam shaping entrance and a beam shaping exit along the beam path, wherein the beam shaping apparatus is configured to define a shape of the ion beam along the beam path; and
   a second magnet disposed between the second accelerator exit and the beam shaping entrance along the beam path, wherein the second magnet is configured to alter the trajectory of the beam path by greater than 90° along a second plane, wherein the first plane and the second plane are not coplanar.

2. The high-energy ion implantation system of claim 1, further comprising:
   a third linear accelerator configured to receive the ion beam at a third accelerator entrance thereof from the second magnet and to accelerate the ion beam to a third accelerator exit along the beam path; and
   a third magnet disposed between the third accelerator exit and the beam shaping entrance along the beam path, wherein the third magnet is configured to alter the trajectory of the beam path by greater than 90° along a third plane, wherein the third plane and the second plane are not co-planar.

3. The high-energy ion implantation system of claim 2, wherein the first plane and the third plane are approximately parallel.

4. The high-energy ion implantation system of claim 2, wherein the first magnet is configured to maximize a first energy spectrum of the ion beam passing between the first accelerator exit and the second accelerator entrance, wherein the second magnet is configured to maximize a second energy spectrum of the ion beam passing between the second accelerator exit and the third accelerator entrance, and wherein the third magnet is configured to maximize a third energy spectrum of the ion beam passing between the second accelerator exit and the beam shaping entrance.

5. The high-energy ion implantation system of claim 2, wherein the first linear accelerator, the first magnet, and the second linear accelerator generally define a first U-shape of the beam path, wherein the second linear accelerator, the second magnet, and the third linear accelerator generally define a second U-shape of the beam path, and wherein the third linear accelerator, the third magnet, and the beam shaping apparatus generally define a third U-shape of the beam path.

6. The high-energy ion implantation system of claim 2, wherein the first linear accelerator, the second linear accelerator, and the third linear accelerator comprise respective first, second, and third RF acceleration stages of an RF linear accelerator comprising a plurality of RF resonators configured to generate an accelerating RF field.

7. The high-energy ion implantation system of claim 1, wherein the first linear accelerator, the first magnet, and the second linear accelerator generally define a first U-shape of the beam path, and wherein the second linear accelerator, the second magnet, and the beam shaping apparatus generally define a second U-shape of the beam path.

8. The high-energy ion implantation system of claim 1, wherein the first linear accelerator and the second linear accelerator comprise respective first and second RF acceleration stages of an RF linear accelerator.

9. The high-energy ion implantation system of claim 1, wherein the first magnet is configured to maximize a first energy spectrum of the ion beam passing between the first accelerator exit and the second accelerator entrance, and wherein the second magnet is configured to maximize a second energy spectrum of the ion beam passing between the second accelerator exit and the beam shaping entrance.

10. The high-energy ion implantation system of claim 1, wherein the beam shaping apparatus comprises:
    a scanner apparatus configured to scan the ion beam in a first direction, thereby defining a scanned ion beam; and
    an angle corrector lens configured to parallelize and shift the scanned ion beam.

11. The high-energy ion implantation system of claim 1, further comprising a final energy magnet comprising an energy defining aperture, wherein the final energy magnet is configured to bend the ion beam at a predetermined angle, and wherein the energy defining aperture is configured to pass only desired ions at a desired energy therethrough.

12. The high-energy ion implantation system of claim 1, wherein the first plane is offset from the second plane by greater than approximately 45°.

13. The high-energy ion implantation system of claim 4, wherein the first plane is offset from the second plane by approximately 90°.

14. The high-energy ion implantation system of claim 1, wherein one or more of the first magnet and the second magnet are configured to minimize an energy dispersion of the ion beam.

15. The high-energy ion implantation system of claim 1, wherein the first magnet is configured to alter the trajectory of the beam path by approximately 180° along the first plane.

16. The high-energy ion implantation system of claim 15, wherein the second magnet is configured to alter the trajectory of the beam path by approximately 180° along the second plane.

17. The high-energy ion implantation system of claim 1, wherein one or more of the first magnet and the second magnet comprise a plurality of pole faces configured to minimize energy dispersion of the ion beam.

18. The high-energy ion implantation system of claim 1, wherein one or more of the first magnet and the second magnet comprises one of a magnetic quadrupole and an electrostatic quadrupole.

19. The high-energy ion implantation system of claim 1, wherein the beam shaping apparatus defines an S-shaped bend in the beam path of the ion beam.

20. A high-energy ion implantation system comprising:
an ion source configured to form an ion beam along a beam path;
a mass analyzer configured to mass analyze the ion beam along the beam path;
a first RF linear accelerator configured to receive the ion beam at a first accelerator entrance thereof from the mass analyzer and to accelerate the ion beam to a first accelerator exit along the beam path;
a second RF linear accelerator configured to receive the ion beam at a second accelerator entrance thereof and to accelerate the ion beam to a second accelerator exit along the beam path;
a first magnet disposed between the first accelerator exit and the second accelerator entrance along the beam path, wherein the first magnet is configured to alter a trajectory of the beam path by approximately 180° along a first plane;
a third RF linear accelerator configured to receive the ion beam at a third accelerator entrance thereof and to accelerate the ion beam to a third accelerator exit along the beam path;
a second magnet disposed between the second accelerator exit and the third accelerator entrance along the beam path, wherein the second magnet is configured to alter the trajectory of the beam path by approximately 180° along a second plane;
a beam shaping apparatus having a beam shaping entrance and a beam shaping exit along the beam path, wherein the beam shaping apparatus is configured to define a shape of the ion beam along the beam path; and
a third magnet disposed between the third accelerator exit and the beam shaping entrance along the beam path, wherein the third magnet is configured to alter the trajectory of the beam path by approximately 180° along a third plane, and wherein the first plane, the second plane, and the third plane are not coplanar.

* * * * *